United States Patent [19]

Nakamura

[11] Patent Number: 4,822,717

[45] Date of Patent: Apr. 18, 1989

[54] IMAGE-FORMING METHOD EMPLOYING LIGHT-SENSITIVE MATERIAL CONTAINING SILVER HALIDE, REDUCING AGENT AND POLYMERIZABLE COMPOUND

[75] Inventor: Taku Nakamura, Kanagawa, Japan

[73] Assignee: Fuji Photo Film Co., Ltd., Kanagawa, Japan

[21] Appl. No.: 73,238

[22] Filed: Jul. 14, 1987

[30] Foreign Application Priority Data

Jul. 25, 1986 [JP] Japan .................... 61-176416

[51] Int. Cl.$^4$ .................... G03C 5/54; G03F 7/26
[52] U.S. Cl. .................... 430/254; 430/138; 430/255
[58] Field of Search ............ 430/138, 254, 253, 264, 430/207, 281

[56] References Cited

U.S. PATENT DOCUMENTS 3,080,230  3/1963  Haydn et al. .................... 430/254
4,629,676 12/1986  Hayakawa et al. .................... 430/199
4,649,098  3/1987  Takeda .................... 430/264

FOREIGN PATENT DOCUMENTS 203613  3/1986  European Pat. Off. ............ 430/203

*Primary Examiner*—Richard L. Schilling
*Attorney, Agent, or Firm*—Sughrue, Mion, Zinn, Macpeak, and Seas

[57] ABSTRACT

An image-forming method which comprises:
  imagewise exposing a light-sensitive material comprising a light-sensitive layer containing silver halide, a reducing agent and a polymerizable compound having a viscosity of not lower than 100 cP at 25° C. provided on a support, to form a latent image of the silver halide;
  simultaneously or thereafter developing the light-sensitive material to polymerize the polymerizable compound within the area where the latent image of the silver halide has been formed; and
  pressing the light-sensitive material on an image-receiving material at a pressure of not lower than 100 kg/cm$^2$ to transfer the unpolymerized polymerizable compound to the image-receiving material.

12 Claims, No Drawings

IMAGE-FORMING METHOD EMPLOYING LIGHT-SENSITIVE MATERIAL CONTAINING SILVER HALIDE, REDUCING AGENT AND POLYMERIZABLE COMPOUND

BACKGROUND OF THE INVENTION

1. Field of the Invention

This invention relates to an image-forming method employing a light-sensitive material comprising a light-sensitive layer containing silver halide, a reducing agent and a polymerizable compound provided on the support.

2. Description of Prior Art

Light-sensitive materials comprising a light-sensitive layer containing silver halide, a reducing agent and a polymerizable compound provided on a support can be used in an image-forming method in which a latent image of silver halide is formed, and then the polymerizable compound is polymerized to form the corresponding image.

Examples of said image-forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image-forming methods, when the exposed silver halide is developed using a developing solution, the polymerizable compound is induced to polymerizable in the presence of a reducing agent (which is oxidized) to form a polymer image. Thus, these methods need a wet development process employing a developing solution. Therefore the process takes a relatively long time for the procedure.

An improved image-forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image-forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image-forming methods are based on the principle in which the polymerizable compound is polymerized within the area where a latent image of the silver halide has been formed.

Japanese Patent Provisional Publication No. 61(1986)-260241 (corresponding to U.S. Patent Ser. No. 854,640) describes another image-forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound in the other area is polymerized.

Japanese Patent Provisional Publication No. 61(1986)-73145 (corresponding to U.S. Pat. No. 4,629,676 and European Patent Provisional Publication No. 0174634A2) describes an embodiment of the image-forming method which comprises: imagewise exposing a light-sensitive material comprising a light-sensitive layer containing silver halide, a reducing agent and a polymerizable compound provided on a support from a latent image of the silver halide; simultaneously or thereafter developing the light-sensitive material; and pressing the light-sensitive material on an image-receiving material to transfer the unpolymerized polymerizable compound to the image-receiving material. According to the embodiment, a clear image can be obtained on the image-receiving material. However, it was observed that the transferred image often suffered stains by an unknown cause which appeared not to relate to the exposure, the development and the transfer procedure.

SUMMARY OF THE INVENTION

The present inventor has found that the above-mentioned stains are caused by a physical damage of the light-sensitive layer. The light-sensitive layer is sometimes damaged incidentally when the light-sensitive material is pressed or scratched during the course of the preparation and the transportation of the material and the image forming procedure. Most of such damage is hardly noticed before the image forming procedure is actually done.

Therefore, an object of the present invention is to provide an image-forming method which gives an improved clear image by employing a light-sensitive material which is easy to handle and resistant to mechanical attack.

There is provided by the present invention an image-forming method which comprises:

imagewise exposing a light-sensitive material comprising a light-sensitive layer containing silver halide, a reducing agent and a polymerizable compound having a viscosity of not lower than 100 cP at 25° C. provided on a support, to from a latent image of the silver halide;

simultaneously or thereafter developing the light-sensitive material to polymerize the polymerizable compound within the area where the latent image of the silver halide has been formed (or the area where the latent image of the silver halide has not been formed); and pressing the light-sensitive material on an image-receiving material at a pressure of not lower than 100 kg/cm$^2$ to transfer the unpolymerized polymerizable compound to the image-receiving material.

The image-forming method of the present invention is characterized that a compound having a viscosity of not lower than 100 cP at 25° C. is employed as the polymerizable compound in the light-sensitive layer and the light-sensitive material is pressed at a pressure of not lower than 100 kg/cm$^2$ in the transfer procedure.

The present inventor has noted that the light-sensitive layer can be resistant to physical attack when the polymerizable compound having a viscosity of not lower than 100 cP at 25° C. is used. Accordingly, the image-forming method of the present invention has advantages in that the light-sensitive material is easy to handle and a clear transferred image can be obtained.

Japanese Patent Provisional Publication No. 61(1986)-73145 discloses various polymerizable compounds which can be employed for the light-sensitive material. In the working examples, polymerizable compounds having a viscosity of lower than 100 cP have been practically used, because the transfer procedure can be easily carried out when the low-viscodity compound is used. Therefore, the light-sensitive layer of the light-sensitive material has been liable to physical damage.

The present inventor has found that a high-viscosity compound can be easily transferred to the image-receiving material when the light-sensitive material is pressed in the transfer procedure at a pressure of not lower than 100 kg/cm², preferably not lower than 200 kg/cm². The present inventor has further found that a compound having a high viscosity can be also easily transferred to the image-receiving material, when the light-sensitive material is pressed while the material is heated. Under the condition, the compounds having a very high viscosity, which have been seldom used, can be easily used as the polymerizable compound.

DETAILED DESCRIPTION OF THE INVENTION

The polymerizable compound used in the image-forming method of the present invention has a viscosity of not lower than 100 cP at 25° C.

The increase in the physical stability of the light-sensitive layer at ordinary temperature, that is, the increase of the viscosity of the polymerizable compound at an ambient temperature (25° C.) is most effective in obviating physical damage (scratch marks, pressed marks, etc.) in the handling of the light-sensitive material in the course of the preparation and the transportation of the material and the image forming procedure.

The viscosity at 25° C. of the polymerizable compound is not lower than 100 cP, preferably not lower than 150 cP, more prefarably not lower than 200 cP.

Where the transfer procedure is carried out at an ambient temperature, the viscosity at 25° C. is preferably not higher than 200,000 cP, more preferably not higher than 20,000 cP.

Where the transfer procedure is to be carried out under a heating condition, a polymerizable compound having a viscosity of higher than 200,000 cP at 25° C. (including a compound which is solid at 25° C.) can be used. In this case, the viscosity of the polymerizable compounds at a heating temperature in the transfer procedure is preferably not higher than 20,000 cP.

Preferred examples of the polymerizable compounds having a viscosity of not lower than 100 cP at 25° C., which can be used in the image-forming method of the invention are described below.

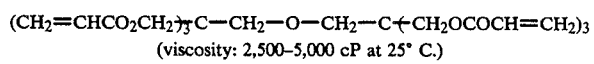
(1)
(viscosity: 2,500–5,000 cP at 25° C.)

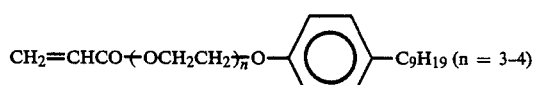
(2)
(viscosity: 100–120 cP at 25° C.)

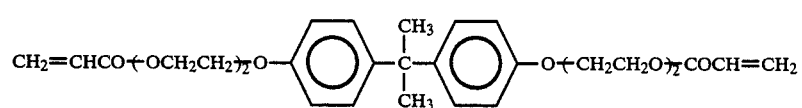
(3)
(viscosity: 800–1,200 cP at 25° C.)

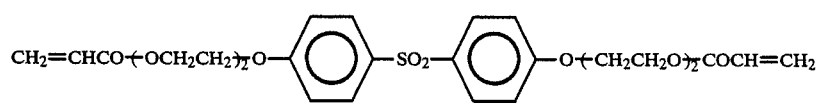
(4)
(viscosity: 10,000–30,000 cP at 25° C.)

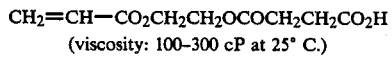
(5)
(viscosity: 100–300 cP at 25° C.)

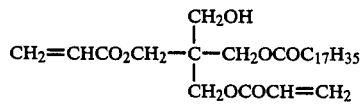
(6)
(viscosity: solid at 25° C. and 100–500 cP at 50° C.)

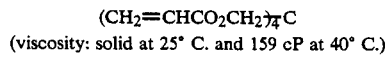
(7)
(viscosity: solid at 25° C. and 159 cP at 40° C.)

-continued

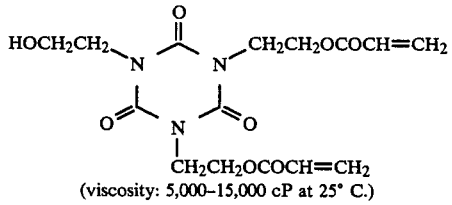
(viscosity: 5,000–15,000 cP at 25° C.)
(8)

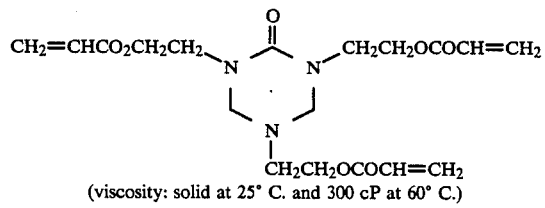
(viscosity: solid at 25° C. and 300 cP at 60° C.)
(9)

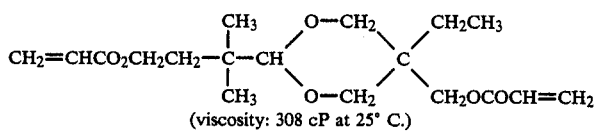
(viscosity: 308 cP at 25° C.)
(10)

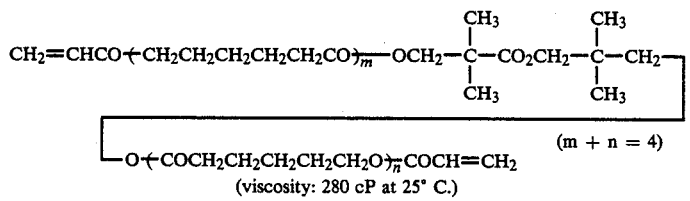
(viscosity: 280 cP at 25° C.)
(11)

Almost all polymerizable compounds described above are known in literatures, and those can be easily synthesized according to teachings of the literatures.

Commercially available polymerizable compounds containing the above compounds can be also used. Examples of the commercially available polymerizable compounds include Aronix M-113, 117, 210, 205, 215, 233, 309, 310, 315, 320, 325, 330, 400, 1100, 1110, 1200, 1210, 1400, 1410, 1420, 1430, 6100, 6200, 6250, 6300, 6400X, 6410X, 6420X, 6500, 7100, 8030, 8060, 8100 and 9050 (tradenames of Toagosei Chemical Industry Co., Ltd.); Ripoxy SP-1506, 1509, VR-77, SP-1563, 2500, 4010, 5003, VR-60 and 90 (tradenames of Showa High Polymer Co., Ltd.); NKester M-230G, CB-1, ABC-100, ABC-200, A-SA, 23G, BPE-100, BPE-200, BPE-500, A-TMM-3, A-BPE-4, ADP-6, U-108A, U-200A, U-4HA, EPM-800, A-TMM3L, EA-800 and EA-6300 (tradenames of Shin Nakamura Chemical Co., Ltd.); 4EG-A and 93G-A (tradenames of Kyoeisha Yushi Co.); and TEGDA, PEG400DA, KAYARAD R-604, R-620, HX-620, R-551, PET-30, D-310, D-330, DPHE, R-712, PET-40 (tradenames of Nippon Kagaku Co., Ltd.).

These polymerizable compounds may be used singly or in combination, so long as the the resulting viscosity is kept not lower than 100 cP at 25° C.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the the silver halide.

Other elements constituting the light-sensitive material will be described hereinafter.

In the image-forming method of the present invention, the above-described compound is employed as the polymerizable compound in the light-sensitive layer of the light-sensitive material and the light-sensitive material is pressed at a pressure of not lower than 100 kg/cm² in the transfer procedure.

The pressure in the procedure is preferably not lower than 200 kg/cm², and more preferably not lower than 300 kg/cm².

The light-sensitive material can be pressed according to any of conventional methods. For example, a press roller can be used.

Where a polymerizable compound having a viscosity of higher than 200,000 cP at 25° C. is used, the light-sensitive material is preferably pressed under a heating condition. The heating temperature preferably is in the range of from 30° C. to 120° C., and more preferably is in the range of from 40° C. to 120° C.

The light-sensitive material can be pressed under a heating condition by a conventional heater roller.

The imagewise exposure, the development process, and the image-receiving material employed in the image-forming method of the invention are described below.

In the image-forming method of the invention, a development process is conducted simultaneously with or after an imagewise exposure.

Various exposure means can be employed in the image-wise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The develoment can be conducted using a developing solution in the same manner as the image-forming method described in Japanese Patent Publication No. 45(1970)-11149. The image-forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. Heating temperatures for the development process using ranges from 80° C. to 200° C., and preferably from 100° C. to 160° C. Various heating patterns are utilizable. The heating time is usually not shorter than 1 second, preferably from 1 second to 5 minutes, and more preferably from 1 second to 1 minute.

In the above development process, a polymerizable compound within the area where a latent image of the silver halide has been formed or the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

After the development process, the light-sensitive material is pressed on an image-receiving material to form an transferred image on the image-receiving material.

The image-receiving material is described hereinbelow. The image-forming method employing the image-receiving material is described in Japanese Patent Provisional Publication No. 61(1986)-278849.

Examples of the material employable as the support of the image-receiving material include baryta paper in addition to various examples which can be employed as the support of the following light-sensitive material. In the case that a porous material, such as paper, is used as a support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system employing various compounds. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the following light-receiving layer is also employable in the image-receiving layer. Further, a polymer having a transmission coefficient of oxygen of not more than $1.0 \times 10^{-11}$ cm$^3$.cm/cm$^2$.sec.cmHg can be used as the binder to protect the color of the image formed on the image-receiving material.

The image-receiving layer can contain a granulated thermoplastic compound to obtain a glossy image. Further, the image-receiving layer can contain a white pigment (e.g., titanium dioxide) to function as a white reflection layer. Furthermore, a photo polymerization initiator or a thermalpolymerization initiator can be contained in the image-receiving layer to polymerize the unpolymerized polymerizable compound.

The image-receiving layer can be composed of two or more layers according to the above-mentioned functions. The thickness of the image-receiving layer preferably ranges from 1 to 100 $\mu$m, more preferably from 1 to 20 $\mu$m.

A protective layer can be provided on the surface of the image-receiving layer.

After the development process, the light-sensitive material is pressed on the image-receiving material to transfer the unpolymerized polymerizable compound to the image-receiving material. Thus, a polymer image can be obtained on the image-receiving material. In the image-forming method of the invention, the light-sensitive material is pressed on the image-receiving material at a pressure of not lower than 100 kg/cm$^2$ as mentioned above.

In the case that the light-sensitive layer contains a color image forming substance, the color image forming substance is fixed by polymerization of the polymerizable compound. Then, pressing the light-sensitive material in contact with the image-receiving material to transfer the color image forming substance in unfixed portion, a color image can be produced on the image-receiving material.

After the image is formed on the image-receiving material, the image-receiving material can be heated to polymerize the transferred unpolymerized polymerizable compound as a fixing treatment for improving the stability of the obtained image.

The light-sensitive material employed in the image-forming method of the invention can be used for monochromatic or color photography, printing, radiography, diagnosis (e.g., CRT photography of diagnostic device using supersonic wave), copy (e.g., computer-graphic hard copy), etc.

The silver halide, the reducing agent and the support which constitute the light-sensitive material with the above-mentioned polymerizable compound are described below. Thus composed material is referred to hereinafter as "light-sensitive material".

There is no specific limitation with respect to silver halide contained in the light-sensitive layer of the light-sensitive material. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogenous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed. A silver halide grain having a core/shell structure in which the silver iodide content in the shell is higher than that in the core can be also employed.

There is no specific limitation on the crystal habit of silver halide grains. For example, a tabular grain having an aspect ratio of not less than 3 can be used.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductions, aminoreductones, o- or p-sulfonamidophenols, o- or p-sulfonamidonaphthols, 2-sulfonamidoindoles, 4-sulfonamido-5-pyrazolones, 3-sulfonamidoindoles, sulfonamidopyrazolobenzimidazoles, sulfonamidopyrazolotriazoles, $\alpha$-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, 291-334 (1977), Research Disclosure No. 17029, 9-15 (June 1978), and Research Disclosure No. 17643, 22-31 (December 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity, Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphthol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxyl)butyloyl}-2-(p- or o-aminophenyl)hydrazine, 1-{2-(2,5-di-t-pentylphenoxy)butyloyl}-2-(p-or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p-or o-methoxyphenyl)hydrazine, 1-(methoxycarbonylbenzohydryl)-2-phenylhydrazine, 1-formyl-2-[4-{2-(2,4-di-tert-pentylphenoxy)butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)2-tritylhydrazine.

The amount of the reducing agent in the light-sensitive layer preferably ranges from 0.1 to 1,500 mole % based on the amount of silver (contained in the above-mentioned silver halide and an organic silver salt).

The light-sensitive material can be prepared by arranging a light-sensitive layer containing the above-mentioned components on a support. There is no limitation with respect to the support. In the case that heat development is utilized in the image-forming method, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g. polyethylene). In the case that a porous material such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610.

Various embodiments of the light-sensitive materials, optional components which may be contained in the light-sensitive layer and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the dyes or pigment may be also contained in the oil droplets.

The oil droplets of the polymerizable compound are preferably prepared in the form of microcapsules. There is no specific limitation on preparation of the microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehyde resin, gelatin, epoxy resin, a complex resin containing polyamide resin and polyurea resin, and a complex resin containing polyurethane resin and polyester resin.

The mean size of the microcapsule preferably ranges from 0.5 to 50 μm, more preferably 1 to 25 μm, most preferably 3 to 20 μm. In the case that silver halide grains are contained in the microcapsule, the mean grain sized of the silver halide grains preferably is not more than the 5th part of the mean size of the microcapsules, more preferably is not more than the 10th part. It is observed that when the mean sized of the microcapsules is not less than 5 times as much as the mean grain size of silver halide grains, even and uniform image can be obtained.

In the case that silver halide grains are contained in the microcapsule, the silver halide grains are preferably arranged in the shell material of the microcapsules.

Further, two or more kinds of the microcapsules differing from each other with respect to at least one of the silver halide, reducing agent and the color image forming substance can be employed. Furthermore, three or more kinds of the microcapsules differing from each other with respect to the color image forming substance is preferably employed to form a full color image.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiators and solvents of the polymerizable compound.

The light-sensitive material can be obtained a polymer image, and further a color image can be produced containing a color image forming substance in the light-sensitive layer.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which developeto give a color in contact with other components include various compounds capable of developing a color through some reaction between two or more components, such as acidbase reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter-Attractive Application and New Development as a Functional Coloring Matter", 26–32 (June, 19, 1980). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

In the case of employing the two compounds as the said image forming substance which react on condition of contact, one of the said compounds and the polymerizable compound are contained in a microcapsule, and the other is arranged outside of the microcapsule in the light-sensitive layer, a color image can be formed on the light-sensitive layer.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the image-forming method, an organic silver contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light sensitive layer to an image-receiving material or an image-receiving layer, or a similar function. The image formation accelerators can be classified into inoragnic bases, organic bases, base precursors, oils, surface active agents, compounds functioning as an anitfogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation acceleratrs are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalky-substituted aromatic amines and bis[p-dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylaction by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

In the light-sensitive material, the silver halide, the reducing agent, the polymerizable compound and the dyes or pigments are preferably contained in a microcapsule and the base or base precursor is prefarably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, or under condition that the base or base precursor is adsorbed on solid particles. Furthermore, the base or base precursor can be contained in a different layer from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

Examples of the compounds functioning as an antifogging agent and/or a development acelerator include a 5- or 6-membered nitrogen containing heterocyclic compound (e.g., a cyclic amide compound), a thiourea derivative, a thioether compund, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —$SO_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure 26–28 (December 1976).

The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidant is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6-18, edited by the Editoral Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisiobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursurs capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

The photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, 9-15 (June 1978).

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

The light-sensitive material is usually prepared by dissolving, emulsifying or dispersing each of the components of the light-sensitive layer in an adequate medium to obtain coating solution, and then coating the obtained coating solution on a support.

The present invention is further described by the following examples without limiting the invention.

EXAMPLE 1

Preparation of silver halide emulsion

In 3,000 ml of water were dissolved 40 g of gelatin and 23.8 g of potassium bromide and the resulting gelatin solution was kept at 50° C. To the gelatin solution, 200 ml of an aqueous solution containing 32.3 g of silver nitrate was added over a period of 15 minutes while stirring. To the solution, 100 ml of an aqueous solution containing 1.66 g of potassium iodide was added over a period of 2 minutes to obtain a silver bromoiodide emulsion. After the emulsion was adjusted to a pH for sedimentation, excess salts were removed, and the emulsion was adjusted to a pH of 6.0. The yield of the emulsion was 400 g.

Preparation of light-sensitive composition

In 100 g of the following polymerizable compound (1) (M-400; tradename of Toagosei Chemical Industry, Ltd.) were dissolved 0.40 g of the following copolymer and 10.00 g of Pargascript Red I-6-B (tradename of Chiba-Geigy).

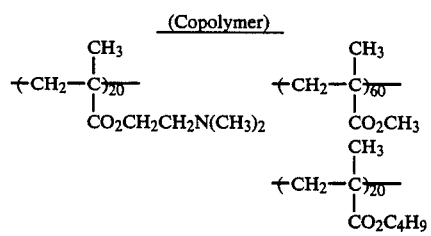

To 18.0 g of the resulting solution were added 1.29 g of the following reducing agent (I), 1.22 g of the following reducing agent (II), 0.20 g of 1% ethyl acetate solution of the following antifogging agent and 0.36 g of Emulex NP-8 (tradename of Nippon Emulsion Co., Ltd.). To the mixture was further added 1.80 g of methylene chrolide, and the resulting mixture was made uniform.

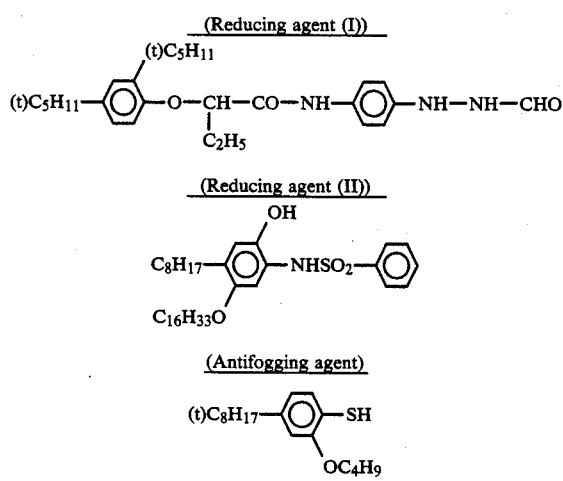

Further, to the resulting solution was added 4.06 of the silver halide emulsion. The resulting mixture was stirred at 18,000 r.p.m. for 3 min. using a homogenizer to obtain a light-sensitive composition.

Preparation of light-sensitive microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% solution of sulfuric acid, the light-sensitive composition was added to the resulting solution, and the mixture was stirred at 7,000 r.p.m. for 2 min. using a homogenizer to emulsify the light-sensitive composition in the aqueous medium.

To 72.5 g of the aqueous emulsion were added 8.32 g 40% aqueous solution of urea, 2.82 g of 11.3% aqueous solution of resorcinol, 8.56 g of 37% of aqueous solution of formaldehyde, and 2.74 g of 8.76% aqueous solution of ammonium sulfate in this order, and the mixture was heated at 60° C. for 2 hours while stirring. After the mixture was adjusted to a pH of 7.0 using 10% aqueous solution of sodium hydroxide, 3.62 g of 30.9% aqueous solution of sodium hydrogen sulfite was added to the mixture to obtain a dispersion containing light-sensitive microcapsules.

Preparation of support

On a paper having a basis weight of 64 g/m² which has no coated layer was coated Chemipal A-100 (tradename of Mitsui Petrochemical Industries, Ltd.) using Meyer bar of #10, and the paper was air-dried at 110° C. for 5 minutes to obtain a paper which has a polyethylene layer having a thickness of about 7 μm.

On the opposite side of the polyethylene layer was coated 10% methanol solution of tricyclohexylguanidine using Meyer bar of #40, and the paper was air-dried at room temperature to obtain a support containing about 6 g/m² of tricyclohexylguanidine.

Preparation of light-sensitive material

To 10.0 g of the light-sensitive microcapsule dispersion was added 1.0 g of 10% aqueous solution of Emulex NP-8 (tradename of Nippon Emulsion Co., Ltd.) to prepare a coating solution. The coating solution was uniformly coated on the polyethylene layer of the support using Meyer bar of #40 to give a layer having a wet thickness of 70 μm and dried at 40° C. to obtain a light-sensitive material (I).

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% aqueous slurry of calcium carbonate, followed by coarsely dispersing in a mixer. The coarse dispersion was then finely dispersed in Dynomile dispersing device. To 200 g of the resulting dispersion were added 6 g of 50% latex of SBR (styrene-butadiene rubber) and 55 g of 8% aqueous solution of polyvinyl alcohol, and the resulting mixture was made homogenous.

The mixture was then uniformly coated on a baryta paper having a basis weight of 43 g/m² to give a layer having a wet thickness of 30 μm and dried to obtain an image-receiving material.

Image-formation on image-receiving material

The light-sensitive material (I) was imagewise exposed to light through a wedge filter in which the density continuously changed from 0 to 2.0, using a tungsten lamp at 5,000 lux for 1 second and then heated on a hot plate at 125° C. for 20 seconds. The exposed and heated light-sensitive material was combined with the image-receiving material and passed through press rolls at pressure of 350 kg/cm². Thus, on the image-receiving material was obtained a clear magenta positive image having a maximum density of 1.10 and a minimum density of 0.18, wherein the maximum density and the minimum density were measured using Macbeth reflection densitometer.

EXAMPLE 2

Preparation of light-sensitive material

To 10.0 g of the light-sensitive microcapsule dispersion prepared in Example 1 were added 1.0 g of 10% aqueous solution of Emulex NP-8 (tradename of Nippon Emulsion Co., Ltd.) and 5.07 g of 10% methanol solution of tricyclohexylguanidine to prepare a coating solution. The coating solution was uniformly coated on a paper having a basis weight of 64 g/m² using Meyer bar of #40 to give a layer having a wet thickness of 70 μm and airdried at 40° C. to obtain a light-sensitive material (II).

Image-formation on image-receiving material

The light-sensitive material (II) was imagewise exposed, heated and pressed on the image-receiving material in the same manner as in Example 1. Thus, on the image-receiving material was obtained a clear magenta positive image having a maximum density of 1.17 and a minimum density of 0.23.

EXAMPLE 3

Preparation of light-sensitive composition

In 100 g of the following polymerizable compound (2) (M-113; tradename of Toagosei Chemical Industry, Ltd.) were dissolved 0.40 g of the copolymer used in Example 1 and 6.00 g of Pargascript Red I-6-B (tradename of Chiba-Geigy).

(Polymerizable compound (2))

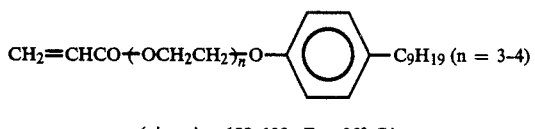

(viscosity: 100–120 cP at 25° C.)

To 18.0 g of the resulting solution were added 1.29 g of the reducing agent (I) used in Example 1, 1.22 g of the reducing agent (II) used in Example 1, 0.20 g of 1% ethyl acetate solution of the antifogging agent used in Example 1 and 0.36 g of Emulex NP-8 (tradename of Nippon Emulsion Co., Ltd.). To the mixture was further added 1.80 g of methylene chrolide, and the resulting mixture was made uniform.

Further, to the resulting solution was added 4.06 of the silver halide emulsion. The resulting mixture was stirred at 18,000 r.p.m. for 3 min. using a homogenizer to obtain a light-sensitive composition.

Preparation of light-sensitive microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% solution of sulfuric acid, the light-sensitive composition was added to the resulting solution, and the mixture was stirred at 7,000 r.p.m. for 2 min. using a homogenizer to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde, and 3.00 g of 8% aqueous solution of ammonium sulfate in this order, and the mixture was heated at 60° C. for 2 hours while stirring. After the mixture was adjusted to a pH of 7.4 using 10% aqueous solution of sodium hydroxide, 3.62 g of 30.9% aqueous solution of sodium hydroxide sulfite was added to the mixture to obtain a dispersion containing light-sensitive microcapsules.

Preparation of light-sensitive material

To 10.0 g of the light-sensitive microcapsule dispersion were added 1.0 g of 10% aqueous solution of Emulex NP-8 (tradename of Nippon Emulsion Co., Ltd.) and 2.80 g of 5% aqueous solution of sodium hdyrogencarbonate to prepare a coating solution. The coating solution was uniforming coated on a polyethylen terephthalate film (thickness: 100 μm) using a coating rod of #40 to give a layer having a wet thickness of 70 μm and air-dried at room temperature to obtain light-sensitive material (A).

EXAMPLE 4

Preparation of light-sensitive material

Each of the light-sensitive materials (B) to (E) was prepared in the same manner as in Example 1, except that 100 g of each of the polymerizable compounds (3), (6), (9) and (1) was respectively used in place of 100 g of the polymerizable compound (2).

(Polymerizable compound (3))

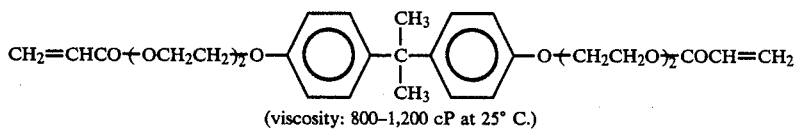

(viscosity: 800–1,200 cP at 25° C.)

(Polymerizable compound (6))

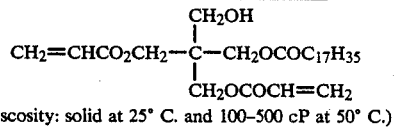

(viscosity: solid at 25° C. and 100–500 cP at 50° C.)

(Polymerizable compound (9))

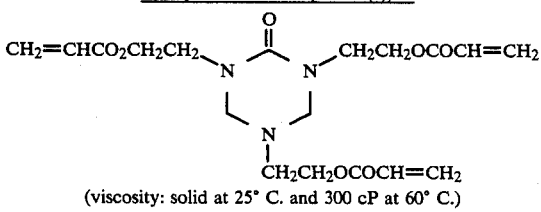

(viscosity: solid at 25° C. and 300 cP at 60° C.)

COMPARISON EXAMPLE 1

Preparation of light-sensitive material

The light-sensitive material (X) was prepared in the same manner as in Example 1, except that 100 g of the following polymerizable compound (x) was used in place of 100 g of the polymerizable compounds (2).

(Polymerizable compound (x)) $C_2H_5C(-CH_2OCOCH=CH_2)_3$

Image-formation on image-receiving material

Each of the light-sensitive materials prepared in Examples 3 & 4 and Comparison Example 1 was imagewise exposed to light through a wedge filter in which the density continuously changed from 0 to 2.0, using a tungsten lamp at 200 lux for 1 second and then heated on a hot plate at 125° C. for 10 seconds. Each of the exposed and heated light-sensitive materials (A), (B) and (X) was combined with the image-receiving material and passed through press rolls at pressure of 350 kg/cm². Alternatively, each of the light-sensitive materials (C), (D) and (E) was combined with the image-receiving material and passed through heat rolls at pressure of 350 kg/cm² and a heating condition of 80° C. Thus, a magenta positive image was obtained on the image-receiving material. The maximum density and the minimum density of the obtained image were measured using Macbeth reflection densitometer.

Further, a saphire stylus having a diameter of 0.2 mm was pressed on each of the light-sensitive materials at pressure of 2 g, and then pulled at a speed of 3 cm/second. Each of the light-sensitive material was then exposed to light all over the light-sensitive layer at 2,000 lux for 1 second, heated and pressed on the image-receiving material as mentioned above. The image-receiving material was then examined whether the magenta colored scratch marks were formed on the image-receiving material.

The results are set forth in Table 1. In Table 1, "Scratch Marks" was evaluated as following grades: A (no scratch mark is observed), B (scratch marks are scarecely observed with the naked eye) and C (scratch marks are clearly observed).

TABLE 1

| Light-Sensitive Material | Polymerizable Compound | Transferred Image | | Scratch Marks |
|---|---|---|---|---|
| | | Maximum Density | Minimum Density | |
| (A) | (2) | 1.17 | 0.28 | B |
| (B) | (3) | 1.22 | 0.13 | A |
| (C) | (6) | 1.11 | 0.17 | A |
| (D) | (9) | 1.13 | 0.12 | A |
| (E) | (1) | 1.09 | 0.12 | A |
| (X) | (x) | 1.17 | 0.15 | C |

It is apparent from the results in Table 1 that each of the obtained images is a clear image having a high maximum density and a low minimum density. Further, each of light-sensitive materials (A) to (E) gives a more improved clear image having few stains such as the scratch marks. Therefore, the image-receiving material of the invention has advantages in that the light-sensitive material is easy to handle and a clear transferred image can be obtained, because the light-sensitive layer is resistant to physical damage.

I claim:

1. An image-forming method which comprises:
   imagewise exposing to light a light-sensitive material comprising a light-sensitive layer containing silver halide, a reducing agent and a polymerizable compound provided on a support, said polymerizable compound being solid at 25° C. to form a latent image of the silver halide;
   simultaneously or thereafter developing the light-sensitive material to polymerize the polymerizable compound within the area where the latent image of the silver halide has been formed; and
   pressing the light-sensitive material on an image-receiving material at a pressure of not lower than 100 kg/cm² while heating to transfer the unpolymerized polymerizable compound to the image-receiving material.

2. The image-forming method as claimed in claim 1, wherein the light-sensitive material is pressed at a pressure of not lower than 200 kg/cm².

3. The image-forming method as claimed in claim 1, wherein the light-sensitive material is pressed at a pressure of not lower than 300 kg/cm².

4. The image-forming method as claimed in claim 1, wherein the development is done by a heat development process.

5. The image-forming method as claimed in claim 1, wherein the development is done by a heat development process at a temperature of from 80° C. to 200° C.

6. The image-forming method as claimed in claim 1, wherein the light-sensitive material is pressed under a heating condision at a temperature of from 30° to 120° C.

7. An image-forming method which comprises:
   imagewise exposing to light a light-sensitive material comprising a light-sensitive layer containing silver halide, a reducing agent and a polymerizable compound provided on a support, said polymerizable compound being solid at 25° C. to form a latent image of the silver halide;
   simultaneously or thereafter developing the light-sensitive material to polymerize the polymerizable compound within the area whre the latent image of the silver halide has not been formed; and
   pressing the light-sensitive material on an image-receiving material at a pressure of not lower than 100 kg/cm² while heating to transfer the unpolymerized polymerizable compound to the image-receiving material.

8. The image-forming method as claimed in claim 7, wherein the light-sensitive material is pressed at a pressure of not lower than 200 kg/cm².

9. The image-forming method as claimed in claim 7, wherein the light-sensitive material is pressed at a pressure of not lower than 300 kg/cm².

10. The image-forming method as claimed in claim 7, wherein the development is done by a heat development process.

11. The image-forming method as claimed in claim 7, wherein the development is done by a heat development process at a temperature of from 80° C. to 200° C.

12. The image-forming method as claimed in claim 7, wherein the light-sensitive material is pressed under a heating condition at a temperature of from 30° to 120° C.

* * * * *